(12) United States Patent
Jain et al.

(10) Patent No.: US 7,130,230 B2
(45) Date of Patent: Oct. 31, 2006

(54) SYSTEMS FOR BUILT-IN-SELF-TEST FOR CONTENT ADDRESSABLE MEMORIES AND METHODS OF OPERATING THE SAME

(75) Inventors: Mohit Jain, Delhi (IN); Danish Hasan Syed, New Delhi (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 55 days.

(21) Appl. No.: 10/922,825

(22) Filed: Aug. 20, 2004

(65) Prior Publication Data

US 2005/0088904 A1  Apr. 28, 2005

(51) Int. Cl.
*G11C 7/00* (2006.01)
(52) U.S. Cl. ............... 365/201; 365/49; 714/718; 714/733
(58) Field of Classification Search ............... 365/201, 365/49; 714/718, 733
See application file for complete search history.

(56) References Cited

U.S. PATENT DOCUMENTS

| | | | |
|---|---|---|---|
| 5,535,164 A * | 7/1996 | Adams et al. | 365/201 |
| 5,675,545 A * | 10/1997 | Madhavan et al. | 365/201 |
| 6,430,072 B1 * | 8/2002 | Chadwick et al. | 365/49 |
| 6,496,950 B1 * | 12/2002 | Zhao et al. | 714/718 |
| 6,523,145 B1 | 2/2003 | Ngo et al. | |
| 6,543,016 B1 | 4/2003 | Lewandowski et al. | |
| 6,550,034 B1 * | 4/2003 | Riedlinger et al. | 714/733 |
| 6,609,222 B1 | 8/2003 | Gupta et al. | |
| 6,665,214 B1 * | 12/2003 | Cheah et al. | 365/185.22 |

* cited by examiner

*Primary Examiner*—Richard Elms
*Assistant Examiner*—Toan Le

(57) ABSTRACT

An improved Built-In-Self-Test (BIST) architecture for Content Addressable Memory (CAM) devices, including a bit scanner for reading out the contents of the matchlines of the CAM cells as a serial bit stream; a bit transition detector that detects and determines the address of each bit transition in the serial bit stream; a state machine that generates bit addresses for each expected transition in the serial bit stream; and an analyser that compares expected transition bit addresses with detected transition addresses and declares a BIST failure if expected and detected transition addresses do not match at any point in the bit stream.

20 Claims, 3 Drawing Sheets

SYSTEMS FOR BUILT-IN-SELF-TEST FOR CONTENT ADDRESSABLE MEMORIES AND METHODS OF OPERATING THE SAME

TECHNICAL FIELD OF INVENTION

The present invention relates generally to the field of Content Addressable Memories ("CAM"); and more particularly, this invention relates to an improved Built-In-Self-Test ("BIST") architecture for Content Addressable Memory ("CAM") devices.

BACKGROUND OF THE INVENTION

Content Addressable Memories are memories in which the data word is selected or identified by its contents rather than by its physical address. In other words, a CAM is a memory that can be instructed to compare a specific pattern of comparand or other reference data with data stored in the CAM array. The entire CAM array is searched in parallel for a match with the comparand data. CAMs are used in a variety of applications, such as sorting large databases, pattern-matching for image processing and voice recognition and cache systems of high speed computing systems. CAM cells are becoming increasingly popular in high-speed network routers and many other applications known in the art of computing.

A standard content addressable memory comprises an array of individual CAM cells. Each CAM cell consists of a data storage unit and comparison circuitry. A CAM cell can store a single bit of data and can compare the stored bit with a comparand or other reference bit during a search operation.

In a common implementation, each row represents a different word of maximum length having depth equal to the total number of columns in the CAM array. During the comparison operation, if all the reference bits match the corresponding stored data bits, a match is declared otherwise the match operation fails. An indicator, commonly known as a "Match Line" ("ML"), associated with each stored word indicates a match or mismatch, which can be detected by a sensing means connected to each ML.

In order to ensure proper functioning of the CAM, a built-in-self-test ("BIST") is often implemented in the CAMs. However conventional methods for BIST implementation often require a large chip area and complex circuitry.

Turning to FIG. 1, illustrated is an exemplary prior art (U.S. Pat. No. 6,430,072) content addressable memory structure with BIST implementation in which the each matchline of the CAM is connected to one of the words, and a self-test matchline compare circuit is connected to the matchlines, adapted to individually test the match function for all of the words. Further, a matchline compare circuit having a plurality of XNOR gates or comparators 1.3a, 1.3b, 1.3c, 1.3d equal in number to the number of words, such that each word is connected to a dedicated comparator to allow each word in the memory array to be individually tested.

During test of the search function, matchline latches 1.1a, 1.1b, 1.1c, 1.1d are loaded with the match results for each word on the matchlines. The match compare shift register 1.2a, 1.2b, 1.2c, 1.2d has been loaded previously with the expected results of the search. Match compare shift register override multiplexers 1.5a, 1.5b, 1.5c, 1.5d are controlled by match compare shift register override select signal 1.6 and operate to select a logic value to which the matchlines will be compared, which will either come from the match compare shift register 1.2a, 1.2b, 1.2c, 1.2d, or the alternate match compare signal 1.4b. The XNOR gates 1.3a, 1.3b, 1.3c, 1.3d compare the results with the expected results, and logic gates 1.7, 1.8, 1.9 compress the compare results into compare signal 1.10 which is "active high" if the matchline values are equal to the expected values. The structure includes an equal number of the words, the first latches, the second latches, the multiplexers, and the comparators, such that each word's match function is individually tested. The override signal line carries a test data pattern that does not match data in any word in the memory array.

This prior art reference patent provides an extra latch and a XOR gate with each matchline in order to compare for match line contents that substantially increase the size and complexity of the memory chip. It is readily evident that there is a need for memory-built-in-self-test technique that is area efficient. It is also readily evident that a need exists for a MBIST that is not only area efficient, but also is simple to implement and is less expensive.

SUMMARY OF THE INVENTION

To address the above-discussed deficiencies of the prior art, an object of the present invention is to provide improved Built-In-Self-Test ("BIST") Architectures for Content Addressable Memories ("CAM").

To achieve above and other objectives, the present invention provides an improved Built-In-Self-Test ("BIST") architecture for Content Addressable Memory ("CAM") devices, comprising:
 a bit scanner for reading out the contents of the matchlines of the CAM cells as a serial bit stream;
 a bit transition detector that detects and determines the address of each bit transition in the serial bit stream;
 a state machine that generates bit addresses for each expected transition in the serial bit stream; and
 an analyser that compares expected transition bit addresses with detected transition addresses and declares a BIST failure if expected and detected transition addresses do not match at any point in the bit stream A related embodiment of the invention further includes an initialization circuit for examining the authenticity of the first bit by checking for a transition for the first bit with respect to a known bit.

In an alternate embodiment, the invention provides a Content Addressable Memory ("CAM") device providing an improved Built-In-Self-Test ("BIST") capability, comprising:
 a CAM cell matchline bit serializer for reading out the contents of matchlines of the CAM cells as a serial bit stream;
 a bit address counter for counting the number of serialized bits;
 a bit transition detector for identifying bit transitions in the serial bit stream;
 a state machine for generating expected bit transition addresses for the matchline data;
 a bit storage register that registering expected transition bit address;
 an analyser that compares expected transition bit address and bit address, and detects for transition at the bit stream and declares a BIST failure if any transition is detected when the expected transition bit address not same as bit address or when expected transition bit address being same as the bit address but no transition is detected.

According to a related embodiment, Content Addressable Memory ("CAM") device, further includes an initialization circuit for examining the authenticity of the first bit by checking for a transition for the first bit with respect to a known bit.

In an alternate embodiment, the invention also provides a method for improving the Built-In-Self-Test ("BIST") capability of Content Addressable Memories ("CAM"), comprising the steps of:

serializing the matchline data of the CAM cells;

counting the number of serialed bits, detecting bit transitions in the serialized data, generating the expected bit transition addresses corresponding to the matchline data, comparing the expected transition bit address with bit address and detecting for a transition occurred at the bit stream, and;

declaring a BIST failure if any transition is detected when the expected transition bit address not same as bit address or when expected transition bit address being same as the bit address but no transition is detected.

In a related embodiment, the method for improving the Built-In-Self-Test ("BIST") further comprises the steps of examining the authenticity of the first bit by checking for a transition for the first bit with respect to a known bit.

In a further embodiment, the invention may be suitably implemented to provide a Pass/Fail circuit, for providing the result of transition occurs at an address that is not recognized as a legal expected transition address.

In a yet further embodiment, an error pattern output block may be provided for scanning data of the match register if any error in encountered.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "circuit", "circuitry" and "architecture" may be used interchangeably and mean any device, system or part thereof that controls at least one operation, such a device may be implemented in hardware, firmware or software, or some combination of at least two of the same. It should be noted that the functionality associated with any particular circuit, circuitry or architecture may be centralized or distributed. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The invention will now be described with reference to the accompanying figures, in which like reference numerals represent like parts, and in which.

DETAILED DESCRIPTION OF THE INVENTION

Figure 2:
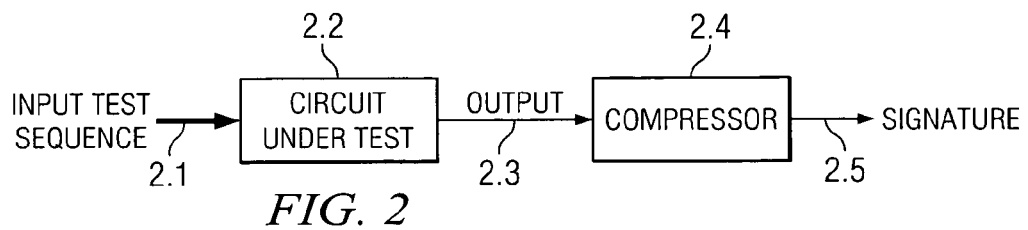
FIG. 2 illustrates a block diagram of an exemplary embodiment of the present invention.
Figure 3:
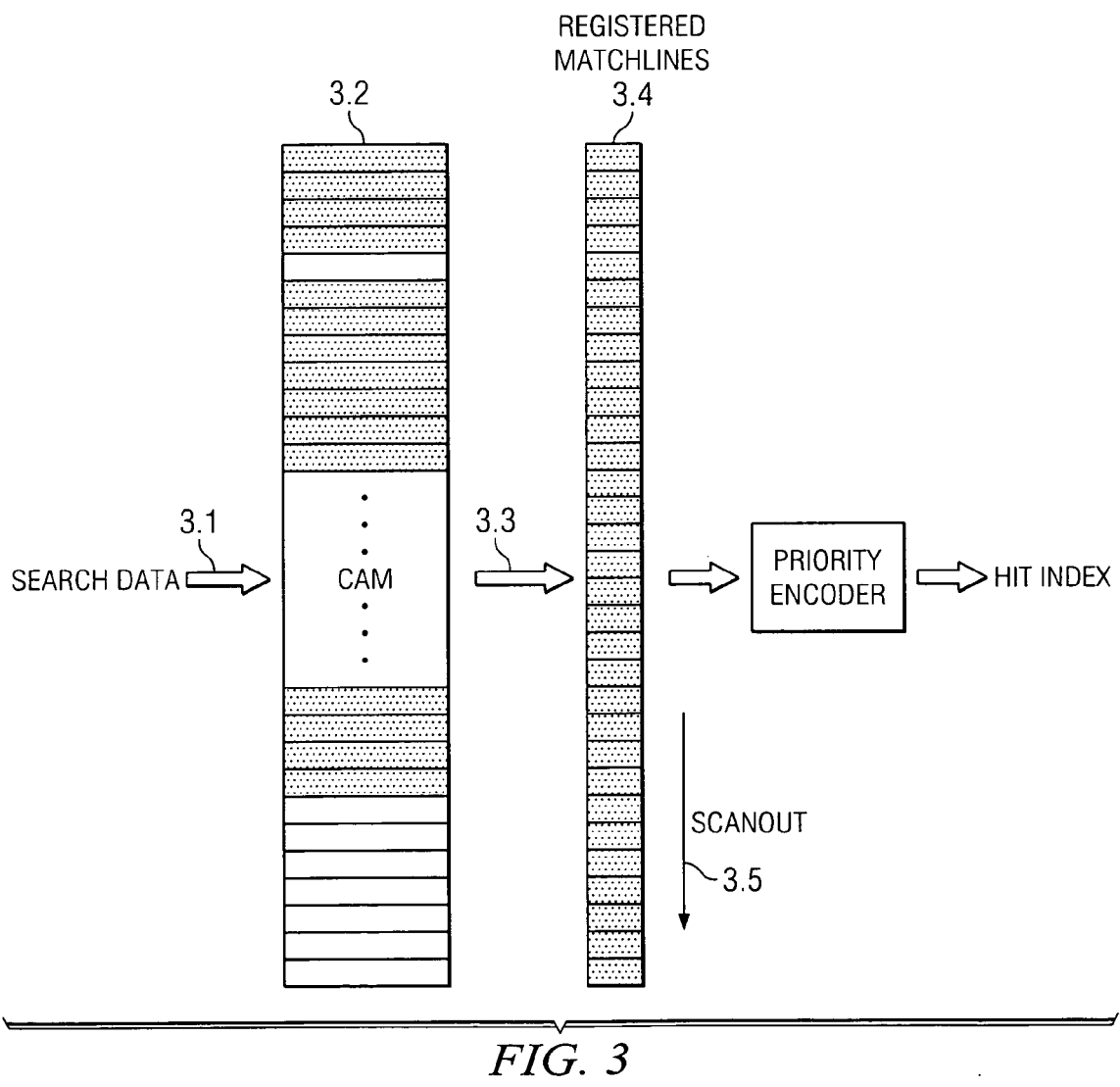
FIG. 3 illustrates a basic structure of a CAM matchlines of one embodiment of the present invention.
Figure 4:
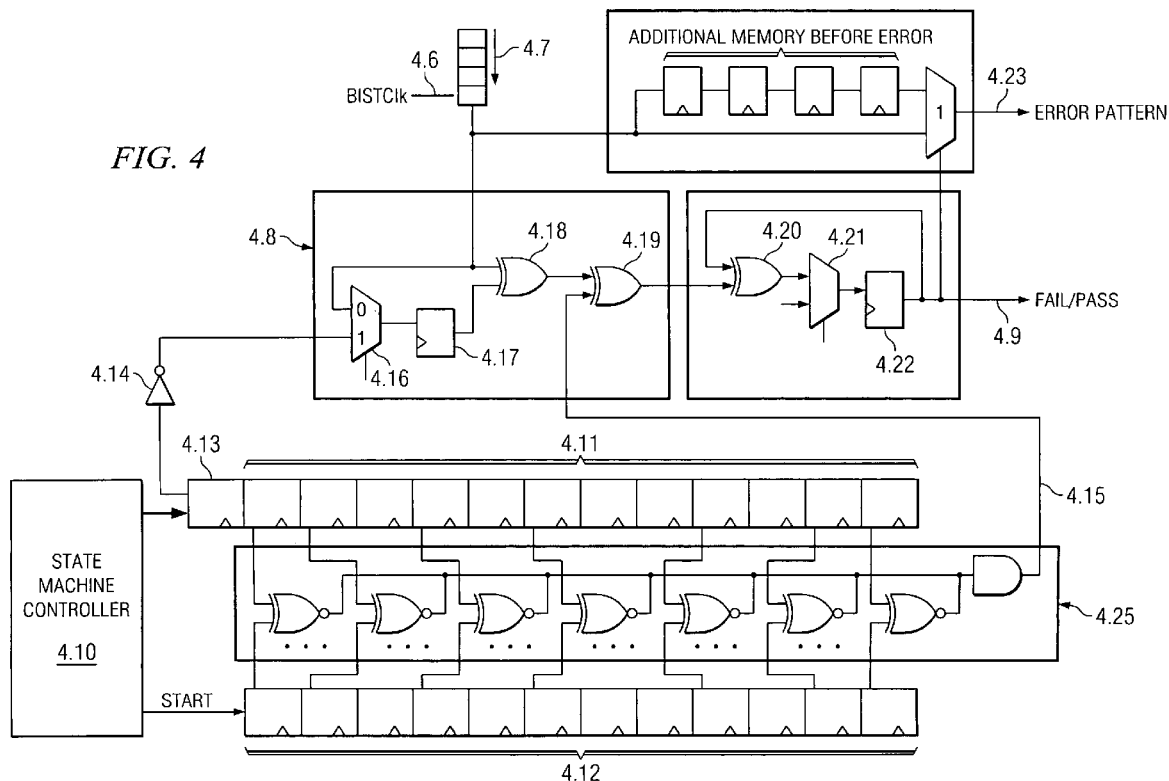
FIG. 4 illustrates a detailed diagram of the MBIST in accordance with the present invention.

FIGS. 2 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

FIG. 2 illustrates a block diagram of an exemplary embodiment of the present invention. The test circuit 2.2 is fed a predetermined input 2.1. The output 2.3 of the test circuit 2.2 is sent to a compressor 2.4. The compressor 2.4 provides an output signature 2.5, which in turn provides an indication for normal or abnormal operation of test circuit.

FIG. 3 illustrates a basic structure of a CAM according to one embodiment of the present invention. The Search Data 3.1 is applied to the CAM 3.2 and the resultant 3.3 for each word line is fed to the registered Matchlines 3.4 which are then scanned out 3.5 for comparison with the expected data through the compression technique, which is illustrated in FIG. 4. In practical search operations, these registered matchlines 3.4 are then fed to a priority encoder whose output is the address of the final hit location.

FIG. 4 illustrates one of the possible embodiments for the compression technique in accordance with the present invention. The $2^n$ registered lines 4.7 will be scanned out consecutively through BIST controller generated clock 4.6.

An initial bit 4.13 equal is the expected first data of the registered matchline 4.7 is loaded after inversion through the NOT gate 4.14 to the output response analyser ("ORA") 4.8. The control signal of the multiplexer 4.16 is high for only the first bit comparison where a virtual transition is considered to have occurred. The inverted data is compared with the actual data through XOR gate 4.18 and a high value at the output of 4.18 indicates that a transition has occurred. This circuitry enables us to check the first bit also since otherwise the first bit goes unchecked due to lack of any previous data. Hence this circuitry compares the first bit with a virtual previous data, which is the inverted form of the initial bit, hence forcing a virtual transition for the first bit. The output of the initial bit circuit at output of 4.19 initiates the signal Fail/Pass 4.9 accordingly. For further cycles, the previous data gets registered at 4.17 and is compared with the next data on 4.18 to ascertain whether a transition has occurred between the consecutive bits or not. The Fail/Pass signal is set Fail if the output 4.19 fails even for one bit from the scanned out pattern.

At each step it would, in parallel, be ascertained whether a transition has occurred or not. Meanwhile the counter 4.12, at the beginning of each iteration, is reset to 0 and is incrementing at each step. The BIST state machine loads the expected transition address on to a storage register 4.11 for expected transition. Since the first bit is shown to have a virtual transition, hence for the first bit comparison the storage register 4.11 is loaded with the first address location at the start of each iteration. The counter 4.12 and the storage register 4.11 are compared at each cycle to ascertain whether the expected transition address has reached or not. The comparison is done with the help of "n XNOR gates" 4.25 and a wired AND logic 4.15 whose output is the second input to the XOR gate 4.19. If this bit is high, it indicates that the address where the transition is expected has reached and if this bit is low, it indicates that the expected address has not yet reached.

The output of XOR gate 4.19 is at high or "1" if and only if the transition has occurred at the required address and at the required address, any transition has actually occurred. This signal serves as an input to the OR gate 4.20 whose registered (at 4.22) output Fail/Pass 4.9 indicates whether the comparison for the iteration is failing or passing. At the start of the next iteration the multiplexer 4.21 helps in resetting the signal 4.9 to "0". Also in case of a failure when the signal 4.9 is high, it can be used to save and scan out the error patterns 4.23 through the presence of additional flops.

The state machine controller 4.10 plays a role in loading the initial bit value at each iteration and loading the counter value(s) in the storage register 4.11 where the transition is expected. All this is synchronized with the BISTclk 4.6. In this scheme of compression using transition, instead of storing and comparing the $2^n$-bit, as is in this case, the state machine controller would have just to feed the corresponding n-bit value of the location where transition is expected. This is where the area for comparison is optimized.

EXAMPLE

For a four-kilo byte and 72 bit wide CAM having an equal number of matchline latches. In the Step A and Step B with N=4096 (equal to the size of memory) and L=72 with w(Write Operation) and c(Compare or Search Operation) with variable K varying from 0 to L−1 in a loop and the address decrementing from N−1 to 0.

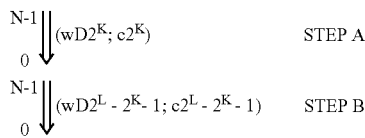

$$\prod_{0}^{N-1}(wD2^K; c2^K) \quad \text{STEP A}$$

$$\prod_{0}^{N-1}(wD2^L - 2^K - 1; c2^L - 2^K - 1) \quad \text{STEP B}$$

The algorithm is where in a particular step data is written in a walking 1 (Step A)/walking 0 (Step B) fashion and the pattern is repeated every 72 locations. After each write operation, a search operation is also performed with the same written data as search data. During the search operation the matchline would be in a walking 1 patterns for the first 72 searches. For each further 72 search operations a hit (a1) would be found in the locations previously found and in the next 72nd location.

For the above situation the worst-case scenario is a maximum of 115 transitions. Let us consider the hardware requirement of the prior-art and the invention in discussion one by one for comparison purposes.

Figure 1:
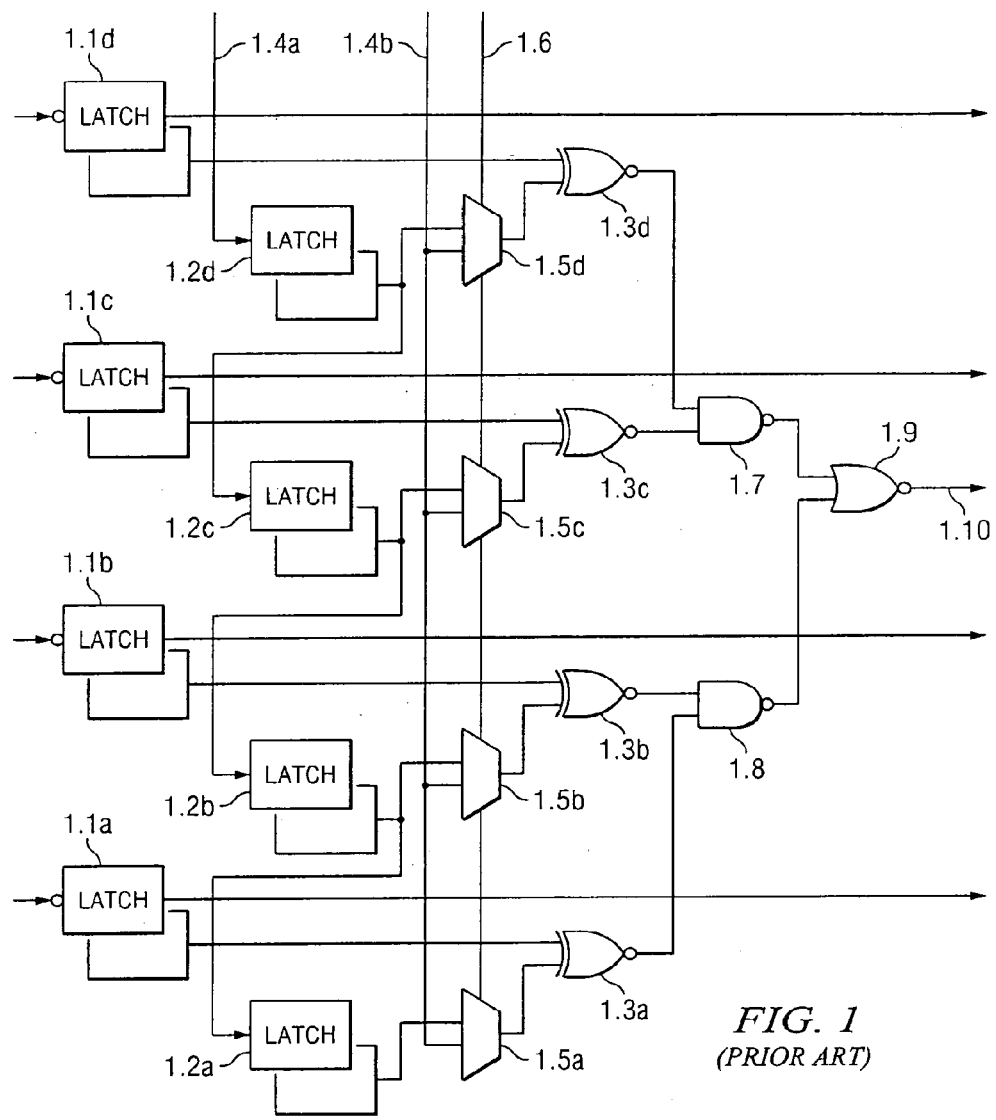
FIG. 1 illustrates a Prior Art circuit diagram of a MBIST, as disclosed by the U.S. Pat. No. 6,430,072.

The algorithm when run on the above-described Prior Art circuit of FIG. 1 would require, apart from the 4K matchline latches, shift register of 4K latches which would be loaded by the state-machine controller with a single bit input to these latches. Also to provide an alternate path to the expected-match data, an additional 4K multipexers are also required. 4K XOR gates for each bit's comparison are also present. Hence the prior art does not implement any compression scheme for matching the output of the matchlines but implements bit-by-bit comparison of the matchlines.

In the present invention, the compression scheme implements finding the transition between successive matchline contents. For the worst-case scenario, the state machine controller would have to store at the most 115 12-bit counters to be loaded into the 12-bit counter. The maximum hardware requirement here, apart from the 4K matchline latches, is two 12-bit counters, one loaded by the state machine controller and the other set to the maximum value at the start of each iteration and to be decremented after each clock cycle, and 12 XNOR gates for comparison purposes of these two 12-bit counters and a wired AND gate; and the ORA consisting of a NOT gate, a multiplexer, a register and two XOR gates, one for determining a transition between the successive scanned out matchline contents and the other for determining whether the expected address of the transition has occurred or not.

Moreover there is no timing overhead in the invention as compared to the invention of the Prior Art circuit of FIG. 1 since for the example illustrated above the prior art requires 4K cycles to load the expected data in the shift registers and our invention too requires the same number of cycles for scanning out the registered matchlines serially. Also in the prior art the presence of the combinational logic 1.3a–d, 1.7,1.8,1.9, which compress the compare results into, compare signal 1.10 and logic that uses such signals (1.10) for determining matchline patterns for 4K words would amount to usage of a very slow clock (Shifting expected data registers 1.2a–d is a relatively fast clock). This would require either slowing down the entire operation (shifting+comparing) to the slowest clock or usage of two clocks, one for shifting and the other for comparison. In second approach BIST algorithm would incur least time for completion. Considering both approaches of prior art implemenation, our proposed scheme is better in terms of time consumed for BIST algorithm because there is no mismatch in clock requirements for compare and shift circuitry, so both work at fastest BIST's clock.

The invention described above is illustrative only and no way limited to the discussed embodiments. A person skilled in the art will appreciate that a different circuit can be derived from the above basic concept for MBIST, any such circuit will fall under the scope of this invention. It is intended that the present invention encompass such changes and modifications as fall within the scope of the appended claims.

What is claimed is:

1. An improved Built-In-Self-Test (BIST) architecture for Content Addressable Memory (CAM) devices, comprising:
   a bit scanner that operates to read out the contents of the matchlines of the CAM cells as a serial bit stream;
   a bit transition detector that operates to detect and determines the address of each bit transition in the serial bit stream;
   a state machine that operates to generate bit addresses for each expected transition in the serial bit stream; and
   an analyser that operates to compare expected transition bit addresses with detected transition addresses and declares a BIST failure if expected and detected transition addresses do not match at any point in the bit stream.

2. An apparatus for testing a content addressable memory (CAM) device comprising a plurality of CAM cells having corresponding matchline outputs, the apparatus comprising:
   a bit scanner, operable to convert the values of the matchlines of the CAM cells into a serial bit stream;
   a bit address counter, operable to determine the address of a bit in the serial bit stream;
   a bit transition detector coupled to the bit scanner, operable to detect a transition in bit value between subsequent bits in the serial bit stream;
   a state machine, operable to generate an expected address of a transition in the serial bit stream; and
   an analyzer coupled to the bit address counter, the bit transition detector, and the state machine, operable to indicate a failure if a bit transition is not detected at the expected address or if a bit transition is detected at an address other than the expected address.

3. The apparatus of claim 2, further comprising an initialization circuit coupled to the bit transition detector and the state machine, operable to test the validity of the first bit in the bit stream.

4. The apparatus of claim 3, wherein
the state machine is further operable to generate an expected value for the first bit in the bit stream, and
the initialization circuit is further operable to cause the bit transition detector to detect a transition if the first bit in the bit stream equals the expected value.

5. The apparatus of claim 2, wherein the analyzer comprises:
a register, operable to store an expected address of a transition in the serial bit stream generated by the state machine; and
a comparator, operable to compare the expected address stored in the register with a value in the bit address counter and indicate whether the compared values match.

6. The apparatus of claim 2, further comprising an error pattern generator, operable to indicate a value of one or more previous bits in the serial bit stream upon an indication by the analyzer of a failure.

7. The apparatus of claim 2, further comprising a clock signal, operable to synchronize the operation of the apparatus.

8. The apparatus of claim 2, wherein the apparatus is adapted for use as a built-in self test apparatus with the CAM device.

9. A self-testing content addressable memory (CAM) device, comprising:
a plurality of CAM cells having corresponding matchline outputs; and
a test apparatus comprising,
a bit scanner, operable to convert the values of the matchlines of the CAM cells into a serial bit stream,
a bit address counter, operable to determine the address of a bit in the serial bit stream,
a bit transition detector coupled to the bit scanner, operable to detect a transition in bit value between subsequent bits in the serial bit stream,
a state machine, operable to generate an expected address of a transition in the serial bit stream, and
an analyzer coupled to the bit address counter, the bit transition detector, and the state machine, operable to indicate a failure if a bit transition is not detected at the expected address or if a bit transition is detected at an address before the expected address.

10. The CAM device of claim 9, wherein the test apparatus further comprises an initialization circuit coupled to the bit transition detector and the state machine, operable to test the validity of the first bit in the bit stream.

11. The CAM device of claim 10, wherein
the state machine is further operable to generate an expected value for the first bit in the bit stream, and
the initialization circuit is further operable to cause the bit transition detector to detect a transition if the first bit in the bit stream equals the expected value.

12. The CAM device of claim 9, wherein the analyzer comprises:
a register, operable to store an expected address of a transition in the serial bit stream generated by the state machine; and
a comparator, operable to compare the expected address stored in the register with a value in the bit address counter and indicate whether the compared values match.

13. The CAM device of claim 9, wherein the test apparatus further comprises an error pattern generator, operable to indicate a value of one or more previous bits in the serial bit stream upon an indication by the analyzer of a failure.

14. The CAM device of claim 9, wherein the test apparatus further comprises a clock signal, operable to synchronize the operation of the apparatus.

15. A method of testing a content addressable memory (CAM) device comprising a plurality of CAM cells having corresponding matchline outputs, comprising the steps of:
converting the values of the matchlines of the CAM cells to a serial bit stream;
counting the addresses of bits in the serial bit stream;
detecting a transition in bit value between subsequent bits in the serial bit stream;
generating an expected address of a transition in the serial bit stream; and
indicating a failure if a bit transition is not detected at the expected address or if a bit transition is detected at an address other than the expected address.

16. The method of claim 15, further comprising the step of testing the validity of the first bit in the bit stream.

17. The method of claim 16, wherein the step of testing comprises the steps of:
generating an expected value for the first bit in the bit stream; and
detectign a transition if the first bit in the bit stream equals the expected value.

18. The method of claim 15, wherein the step of indicating comprises the steps of:
storing an expected address of a transition in the serial bit stream;
comparing the expected address with a bit address; and
indicating whether the compared values match.

19. The method of claim 15, wherein the step of indicating comprises the step of generating an error pattern representing a value of one or more previous bits in the serial bit stream.

20. The method of claim 15, further comprising the step of synchronizing the performance of the steps of the method with a clock signal.

* * * * *

UNITED STATES PATENT AND TRADEMARK OFFICE
CERTIFICATE OF CORRECTION

PATENT NO. : 7,130,230 B2  Page 1 of 1
APPLICATION NO. : 10/922825
DATED : October 31, 2006
INVENTOR(S) : Mohit Jain and Danish Hasan Syed It is certified that error appears in the above-identified patent and that said Letters Patent is hereby corrected as shown below:

Column 2, line 39, insert -- . -- after the term "stream";

Column 3, line 2, delete "cheeking" and replace with -- checking --;

Column 4, line 10, delete "image processing system" and replace with -- BIST systems --.

Signed and Sealed this

Twenty-seventh Day of March, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,130,230 B2 | Page 1 of 1 |
| APPLICATION NO. | : 10/922825 | |
| DATED | : October 31, 2006 | |
| INVENTOR(S) | : Jain et al. | |

It is certified that error appears in the above-identified patent and that said Letters Patent is hereby corrected as shown below:

On the cover page, item

[*] Notice: Subject to any disclaimer, the term of this patent is extended or adjusted under 35 USC 154(b) by (55) days Delete the phrase "by 55 days" and insert --by 48 days--

Signed and Sealed this

Nineteenth Day of June, 2007

JON W. DUDAS
*Director of the United States Patent and Trademark Office*